(12) United States Patent
Tsai

(10) Patent No.: US 11,289,604 B2
(45) Date of Patent: Mar. 29, 2022

(54) METHOD FOR FABRICATING A SEMICONDUCTOR DEVICE

(71) Applicant: United Microelectronics Corporation, Hsinchu (TW)

(72) Inventor: Tsung-Hsun Tsai, Chiayi (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 0 days.

(21) Appl. No.: 16/530,954

(22) Filed: Aug. 2, 2019

(65) Prior Publication Data

US 2021/0036152 A1  Feb. 4, 2021

(51) Int. Cl.
*H01L 29/76* (2006.01)
*H01L 29/78* (2006.01)
*H01L 27/088* (2006.01)
*H01L 21/02* (2006.01)
*H01L 21/3205* (2006.01)
*H01L 29/45* (2006.01)

(52) U.S. Cl.
CPC ...... *H01L 29/7843* (2013.01); *H01L 21/0206* (2013.01); *H01L 21/02356* (2013.01); *H01L 21/32053* (2013.01); *H01L 27/088* (2013.01); *H01L 29/456* (2013.01)

(58) Field of Classification Search
None
See application file for complete search history.

(56) References Cited

U.S. PATENT DOCUMENTS

| | | | |
|---|---|---|---|
| 7,494,878 B2 | 2/2009 | Lee | |
| 7,585,790 B2* | 9/2009 | Hung | H01L 21/823807 257/E21.328 |
| 7,795,644 B2 | 9/2010 | Wang | |
| 8,716,146 B2 | 5/2014 | Nowling | |
| 9,105,651 B2 | 8/2015 | Chang | |
| 9,318,338 B2 | 4/2016 | Liao | |
| 10,103,169 B1* | 10/2018 | Ge | H01L 27/11575 |
| 2004/0104405 A1* | 6/2004 | Huang | H01L 21/823807 257/199 |
| 2007/0235823 A1* | 10/2007 | Hsu | H01L 21/823807 257/411 |
| 2014/0273368 A1* | 9/2014 | Hung | H01L 21/823814 438/230 |

FOREIGN PATENT DOCUMENTS

CN 102437046 A 5/2012

* cited by examiner

*Primary Examiner* — Hung K Vu
(74) *Attorney, Agent, or Firm* — Winston Hsu

(57) ABSTRACT

A new method for fabricating a semiconductor device with high selection phosphoric acid solution and eliminating the step of oxide removal and thus reducing oxide loss to improve yield gain and cost saving.

7 Claims, 7 Drawing Sheets

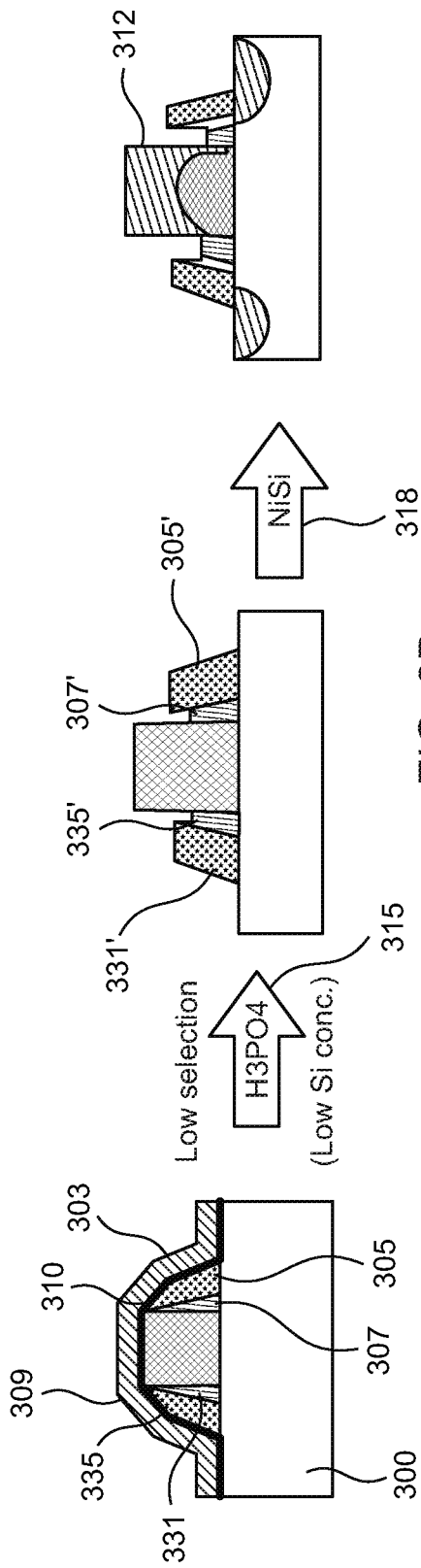
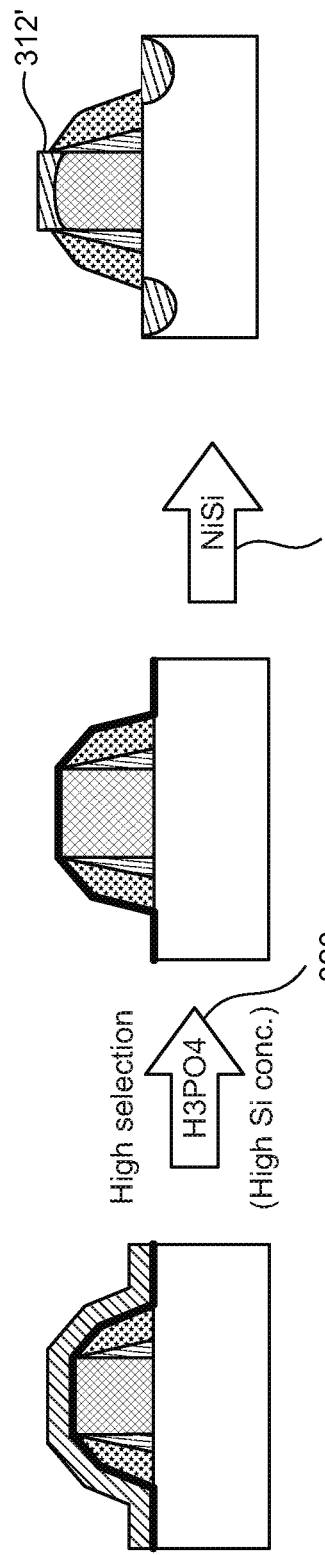
FIG. 3B
FIG. 3C

METHOD FOR FABRICATING A SEMICONDUCTOR DEVICE

BACKGROUND

Field of the Invention

The present invention relates to semiconductor processing techniques, and more particularly to a method for fabricating a semiconductor device.

Description of Related Art

Stress memorization technique (SMT) is often used to manufacture high efficiency low nanometer (for example 28 nm generation and beyond) semiconductor devices. Conventional SMT process uses stressed film deposition and annealing to apply the stress to the substrate. The stressed film is then removed prior to subsequent processes. Some devices require an oxide layer to define silicide and non-silicide regions, and SAB (silicide block) process is used for such purposes.

Referring to FIG. 1, the prior double-layered SMT process includes deposit buffer oxide (101), deposit nitride film (102), apply RTP (rapid thermal process) or Laser Spike anneal (103), remove nitride by wet etching (104), remove oxide with SPM (sulfuric peroxide mix) (105), and deposit oxide (106).

The wet etching used to remove nitride layer can, for example, be etched by hot phosphoric acid solution. Conventional method maintains the etching at a low temperature as such between 110 degrees C. to 130 degrees C. These temperatures are used because they provide adequate etching rate and do not damage the surrounding structures. Lower temperature also allows decreasing concentration of phosphoric acid in the solution.

The conventional SPM clean process uses a solution of approximately 3 parts sulfuric acid to 1 part of hydrogen peroxide at about 130 degrees C. to strip organic material and photoresist from silicon wafers quickly and effectively. Chemical ratio and temperature are maintained within safe limits and that the solution and wafers are contained safely in impervious baths. While the concentration may vary from 3 to 1 to a maximum of 7 to 1 and the temperature used may be as high as 140 degrees C. This removal can also be etched by DHF (diluted hydrofluoric acid) solution. DHF is used in various applications in semiconductor industry, such as removal of natural Si-Oxide from wafer surface, etching of a defined layer-size of Si-Oxide, or saturation of wafer surface with hydrogen.

Under the conventional process, the spacer is often damaged, causing the polysilicon gate to emerge above the spacer. Furthermore, conventional DHF dip removes the native silicon dioxide layer, easily causing deep divot and resulting in transistor kink effect of drain current. The process window or margin will be reduced due to the multi-step deposition and etching process possibly resulting in higher leakage current induced by a severe STI (shallow trench isolation) divot and spacer damage Therefore, there is a need for an improved manufacturing process for semiconductor device to reduce multiple and repeated deposition of layers, and higher efficiency in cleaning to prevent damage and improve Vmin window.

SUMMARY

The present invention provides a method of manufacturing a semiconductor memory device. In the method, a substrate is provided. Then, a plurality of gate structures and a plurality of dielectric layers and sidewalls (i.e. spacers) of the gate structures are formed. In one embodiment, the substrate has a silicide region and a non-salicide region.

In one embodiment, the method of this invention includes processing the silicide region using a high selection H3PO4 to remove the nitride at a high temperature with high silicon concentration to preserve the base oxide. The spacers are preserved and IDDQ testing, measuring the supply current (IDD) in the quiescent state, shows reduced presence of manufacturing faults.

In another embodiment, SPM is used to clean the oxide layer, but without DHF; oxide is preserved thus reducing the divot and improving Vmin and Kink Effect. The based oxide is preserved and serves as the silicide block oxide. Therefore, the need to redeposit of oxide is eliminated and thus achieves a saving in manufacturing costs.

A more complete understanding of the present invention will be apparent from the following Detailed Description and the accompanying drawings.

BRIEF DESCRIPTION OF THE DRAWINGS

The accompanying drawings are included to provide a further understanding of the invention and form a part of the specification of the application. The drawings illustrate the embodiments of the invention, and, together with the detailed description. Serve to explain the principles of the invention.

FIG. 3B comprises cross-sectional views of a semiconductor device in Z1 fabricated in accordance with a prior art method;

FIG. 3C comprises cross-sectional views of a semiconductor device in Z1 fabricated in accordance with an embodiment of the present invention;

Like reference numbers and designations in the different figures indicate like elements.

DETAILED DESCRIPTION

Figure 1:
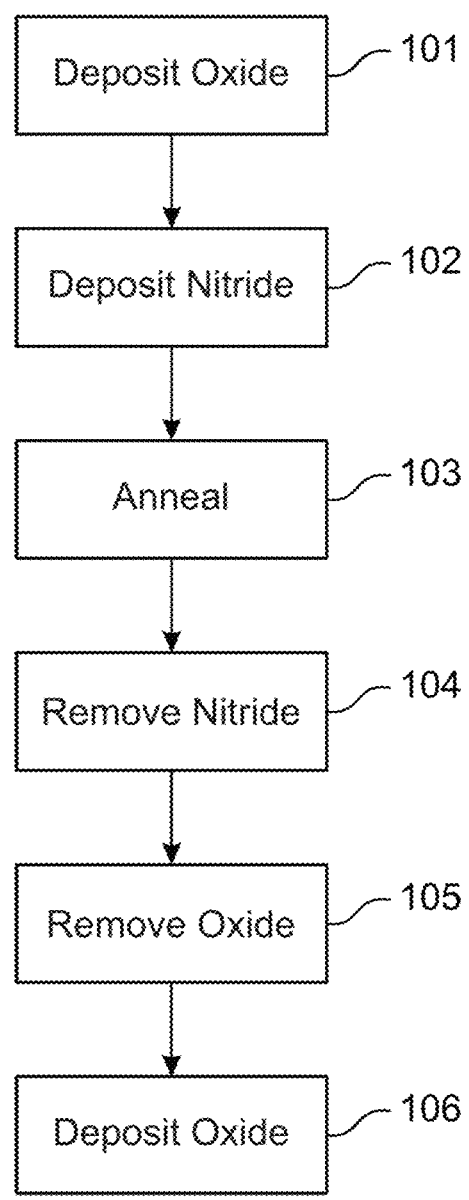
FIG. 1 is a flow diagram of a conventional double-layered SMT process for fabricating a semiconductor device.

Advantages and features of embodiments may be understood more readily by reference to the following detailed description of preferred embodiments and the accompanying drawings. Embodiments may, however, be embodied in many different forms and should not be construed as being limited to those set forth herein. Rather, these embodiments are provided so that this disclosure will be thorough and complete and will fully convey exemplary implementations of embodiments to those skilled in the art, so embodiments will only be defined by the appended claims.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the embodiments.

Unless otherwise defined, all terms (including technical and scientific terms) used herein are intended to be understood as commonly used by one of ordinary skill in the art. It will be further understood that terms, such as those defined in commonly used dictionaries, should be interpreted as having a meaning that is consistent with their meaning in the context of the relevant art.

Figure 3A:
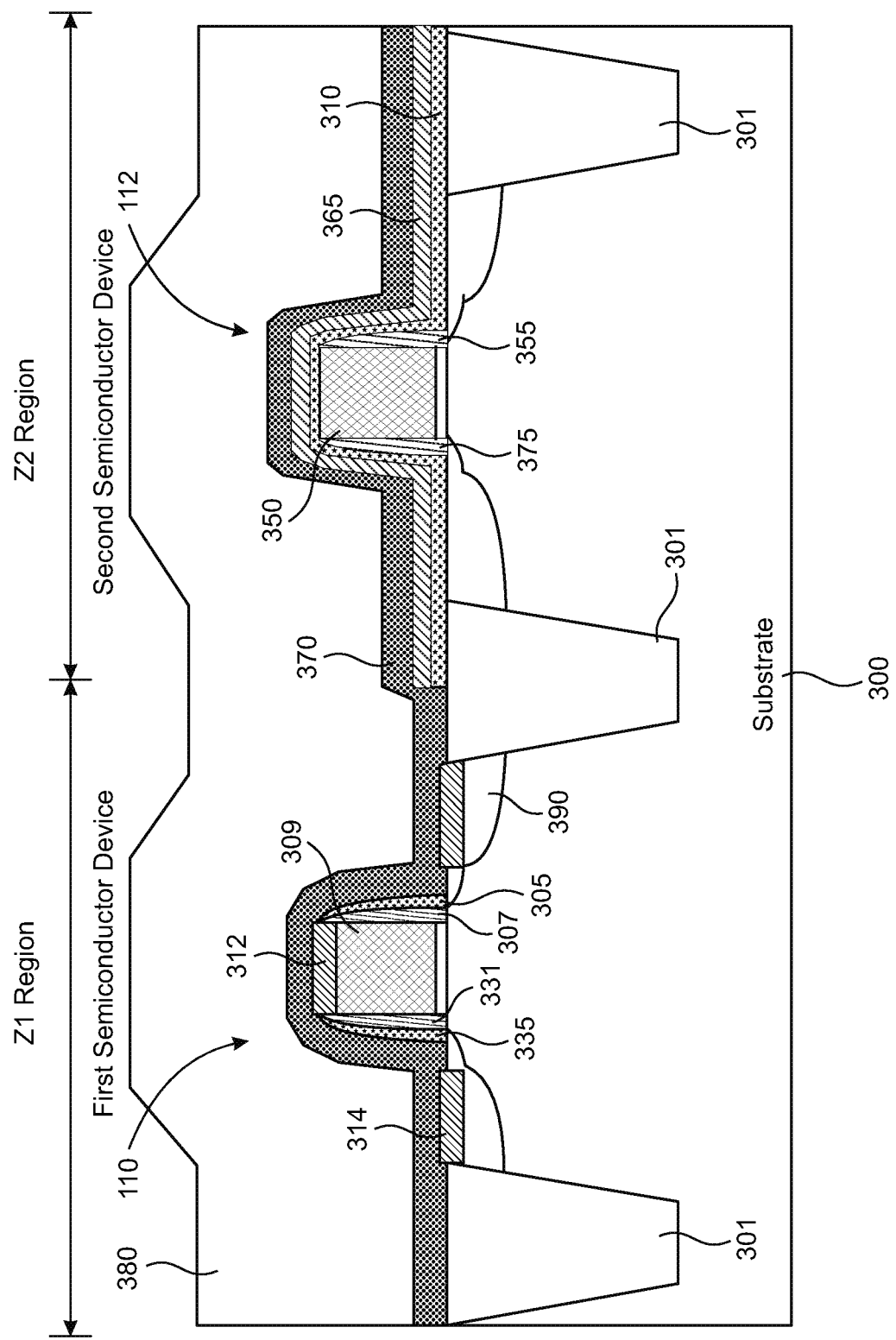
FIG. 3A is cross-sectional views of a semiconductor device fabricated in accordance with the SMT process, including Z1 and Z2.

Provided in this invention is an improved method of fabricating a semiconductor device in FIG. 3A, which comprises a silicide region Z1 and a non-salicide region Z2. As semiconductor device technology develops, devices such as metal oxide semiconductor (MOS) devices become smaller in order to improve the performance of the devices. As MOS devices become smaller, the gate length of a gate electrode, or the channel width, decreases. Furthermore, junction depth of source/drain regions becomes shallower. Accordingly, the sheet resistance of the gate electrode and source/drain regions increases.

In order to reduce the sheet resistance of the gate electrode and the source/drain regions, self-aligned silicide (SAL) is often formed at the gate electrode, the source, and the drain. This reduces the sheet resistance caused by the miniaturization of the semiconductor device.

Semiconductor devices often include regions where salicide is formed and regions where salicide should not be formed, as shown in FIG. 3A as Z1 and Z2 in substrate 300.

Referring to FIG. 3A, a substrate 300 is provided to serve as a base for forming the semiconductor device. The substrate 300 may be bulk silicon or an SOI (silicon-on-insulator), but is not limited thereto. For example, the substrate 300 may be a silicon substrate or a substrate containing other materials, e.g., silicon germanium (SiGe), indium antimonide (InSb), a lead telluride compound, indium arsenic (InAs), indium phosphide (InP), gallium arsenide (GaAs), or gallium antimonide (GaSb). In some embodiments, the substrate 300 may be formed such that an epitaxial layer is formed on a base substrate.

Currently, with the development of semiconductor devices, the self-aligned metal such as nickel (Ni) or titanium (Ti) is introduced for generating a silicide on the exposed source/drain regions and the gate, such as 312 shown in FIG. 3B and 312' shown in FIG. 3C. Metals such as Ni or Ti reacts with silicon, but does not react with the silicon oxides such as silica (SiO2), silicon nitride such as silicon nitride (Si3N4) or silicon oxynitride (SiON).

The method of self-aligned silicide a relatively straight forward metallization procedures; however, in the production process of semiconductor devices, some devices require a salicide region, and some devices require non-salicide region.

Figure 2:
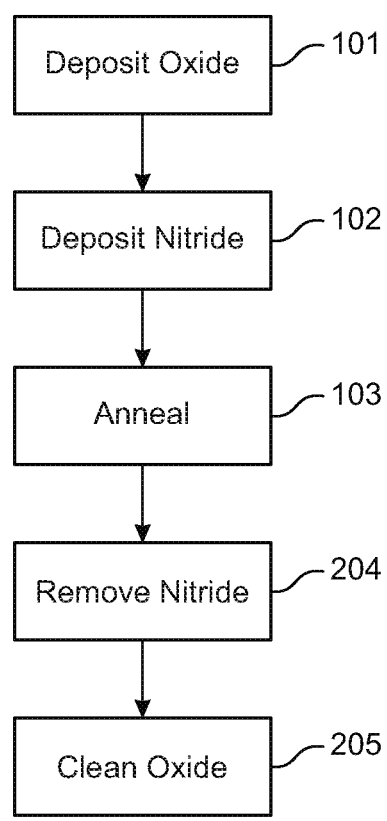
FIG. 2 is a flow diagram of a SMT process for fabricating a semiconductor in accordance with an embodiment of the present invention.

Referring to FIG. 3A, FIG. 3C and FIG. 2, in the beginning of SMT process, a stress layer (not shown) is blanketly formed to cover the Z1 region and Z2 region. The stress layer can be a multilayer structure. For example, the stress layer can be a composite layer including a silicon oxide layer 310 and a silicon nitride layer 303. Therefore, at first, the silicon oxide layer 310 is deposited, and then the silicon nitride layer 303 is deposited on the silicon oxide layer. Next, a first annealing process is applied to the silicon substrate 300. The first annealing process may include a step of performing a rapid thermal process, a step of performing a laser annealing process, or a step of performing combination of a rapid thermal process (RTP) and a laser annealing process. The RTP process is applied to the source/drain region and a temperature is more than 550° C.

After SMT process, the silicon nitride layer 303 is removed from the Z1 region and Z2 region completely and leaving the stressed silicon oxide layer 310 on the Z1 region and Z2 region. Thereafter, a SAB layer 365 is blanketly and conformally formed on the stressed silicon oxide layer 310 in the Z1 region and Z2 region. Then, a patterned photoresist layer (not shown) is formed to cover the SAB layer 365 and the stressed oxide layer 310 in the Z2 region. A portion of the SAB layer 365 and the stressed oxide layer 310 in the Z1 region are removed by one or more etching processes, so as to expose desired surface for forming silicide in the Z1 region. The SAB layer 365 and the stressed oxide layer 310 are patterned together, therefore the stressed oxide layer 310 is coextensive with the SAB layer 365.

Thereafter, a self-aligned silicide (salicide) process is performed. For example, a metal-atom-containing layer (not shown) is blanketly formed on the substrate 300, covering the gate structures 309, the active source and drain regions (S/D regions) 390 in the Z1 region, the SAB layer 365 in the Z2 region, the STI 301 and others region on the substrate surface. The metal-atom-containing layer may comprise a metal layer, a metal alloy layer or a metal-compounds layer. In this embodiment, the metal-atom-containing layer is a nickel-platinum alloy (Ni/Pt) layer, but not limited thereto. The metal-atom-containing layer may also include other materials that can react with silicon atom, such as cobalt (Co) or titanium (Ti). Afterwards, a first annealing process (such as a RTP process) is carried out on the metal-atom-containing layer, wherein the temperature of the first annealing process is preferably between 200~300° C., which allows the metal-atom-containing layer to react with and the source and drain regions and the gate structure, so as to form a transitional salicide layer (not shown). The main material of the transitional salicide layer can be Ni2Si, but is not limited thereto. It is worth noting that the surface that reacts with the metal-atom-containing layer requires silicon atoms, so the transitional salicide layer can only be formed on the gate structure, on the surface of the S/D regions and other substrate surface that is not covered by the SAB layer (silicide block may be formed optionally to cover the areas needing no salicide).

After the rest of the unreacted metal-atom-containing layer is removed entirely by one or more wet etching processes, the transitional salicide layer disposed on the S/D regions 390, on the top of the gate structure 309 and on the surface of the substrate 300 is exposed. A cleaning process is selectively performed. Afterwards, a second annealing is performed on the transitional salicide layer. The second annealing process uses a higher temperature to modify the phase of the transitional salicide layer to become salicide layer with lower resistance. In this embodiment, the salicide phase state from the nickel-rich (Ni2Si) is modified into silicon-rich (NiSi2), wherein the NiSi2 is a monosilicide with low Rs values, but not limited thereto.

After forming the first semiconductor device 110 and the second semiconductor device 112, a cap layer or a contact etch stop layer (CESL) 370 and an inter-layer dielectric (ILD) layer 380 are formed. Before forming the contact etch stop layer (CESL) 370, an optional buffer layer (not shown) is blanketly and conformally formed to cover the whole substrate 300. The buffer layer may be a thin oxide layer. The material of the contact etch stop layer (CESL) 370 may be silicon nitride formed by a low-pressure chemical vapor deposition process, for example. Furthermore, the value of stress of the contact etch stop layer (CESL) 370 can be adjusted by performing a doping process or an annealing process or can be adjusted by tuning parameters used for deposition. The stress of the contact etch stop layer (CESL) 370 may be tensile stress or compressive stress. The inter-layer dielectric (ILD) layer may comprise USG (undoped silicate glass), a low-temp deposited USG, SiC, SiO2, SiN, SiCN, plasma-enhanced TEOS oxide, etc.

In the non-salicide region (Z2), a silicide blocking layer (Salicide Alignment Block of SAB) is introduced to cover up the non-salicide region where a metal material such as Ni does not react. In substrate 300, a gate structure 350 in this region is formed, with spacers 375 and 355 formed to the sides of gate 350. The spacers 375 and 355 can be a single layer or a multilayer structure. A stressed oxide layer 310 is disposed on top of gate 350 and spacers 375 and 355. A SAB layer 365 is disposed on the stressed oxide layer 310. A contact etch stop layer (CESL) 370 is disposed on layer 365. It is understood that the layers 310, 365, and 370 may comprise different materials. For example, the stressed oxide layer 310 may be silicon oxide. SAB layer 365 may comprise dielectric material such as silicon nitride, silicon-rich oxide (silicon rich Oxide, O), SiO2, SiON, SiO2/SiN/SiO2 (ONO structure), or other nitride layers. The contact etch stop layer (CESL) 370 may be a silicon nitride layer, or a composite layer including a silicon oxide layer and a silicon nitride layer. There may also be additional layers not shown here. It is understood that gate structure 350 is for illustrative purpose, and can be replaced with any semiconductor device such as a transistor or a resistor without silicide formed thereon.

Next to isolation trench 301, in the silicide region (Z1) of substrate 300, a gate structure 309 is prepared. Gate structure 309 is typically a polysilicon gate. There can be a plurality of spacer structures are formed adjacent to the gate structure 309. The spacers can be a single layer or a multilayer structure. In this embodiment, spacer 307 and spacer 305 to the right of the gate structure 309, and their counterparts 331 and 335 to the left of the gate structure 309. There may be active source and drain regions 390 formed on substrate 300 by implanting n-type and p-type dopant species, and there may be a channel region (not shown) under the gate structure 309 between the source and drain regions. Furthermore, a contact etch stop layer (CESL) 370 is applied on top surfaces of the gate structure 309 and spacers 307, 305, 331 and 335, and cover the substrate 300. The contact etch stop layer (CESL) 370 can be a single-layer structure that includes silicon oxide or silicon nitride. In another embodiment, the contact etch stop layer (CESL) 370 is a double-layer structure comprising a nitride layer, and an oxide layer positioned vertically below the nitride layer. The contact etch stop layer (CESL) 370 can serve as an etching stop for precise etching of contact holes within the inter-layer dielectric (ILD) layer 380.

The manufacturing steps shown in FIG. 1 are commonly used. An oxide layer is deposited (step 101), for example, by a high temperature oxidation process or SACVD process. The nitride layer 303 can be formed (step 102) by a chemical vapor deposition process. Various teachings on such processes are available, such as in U.S. Pat. No. 9,105,651 which teaches about stress-generating layers among other things, and the entire disclosure is hereby incorporated by reference.

The thickness of these layers can be varied according to the size of the semiconductor device being manufactured. Some teaching and variation of such manufacturing processes can be found in U.S. Pat. No. 7,494,878, the entire disclosure is hereby incorporated by reference.

The annealing step 103 can comprise a laser spike annealing (LSA) or a rapid thermal process (RTP). Traditionally, the oxide will be removed (step 105) and the deposited (step 106). Afterwards, a silicide process may be performed. However, this is outside the scope of this invention.

Traditionally the oxide layer 310 and nitride layer 303 can both be removed. The nitride layer can be removed (step 104) by a chemical solution including a phosphoric acid component with low silicon concentration.

The improved manufacturing method of this invention is shown in FIG. 2, where the removal of nitride (step 204) involves innovative steps, and oxide is not removed by cleaned (step 205).

Referring to FIG. 3B, in prior art, where step 315 uses low selection H3PO4, the oxide layer 310 is also removed, causing the polysilicon gate to be exposed as shown in FIG. 3B. This causes problems. Referring to FIG. 3B, spacer 331, 335, 307, 305 become damaged and looking like 331', 335', 307', 305'. The silicide process (not shown) will, after NiSi deposition (step 318), result in undesirable accumulation of NiSi in area 312. In a worse case, undesirable accumulation of NiSi can be further formed covering the spacers and the source and drain regions, so as to result in unwanted electrical short of source and drain regions to gate structure.

In one embodiment of this invention, the nitride layer 303 is removed (step 320) by high selection H3PO4, leaving the oxide layer 310 in place. When, for example NiSi is applied at step 322, nickel is deposited at the right places on the semiconductor device, with desirable accumulation in area 312'. The optimal silicon concentration is about in a range between 75 to 140 PPM. The temperature at which the solution can be is in the range of 135 to 165 centigrade.

The term "high selection" means more selective etching of the silicon nitride layer may be achieved. This selectivity may be as high as 70 times relative to and silicon oxide layer. In one embodiment of this invention, the etching rate of the silicon nitride layer is 45 angstrom per minute and the etching rate of the silicon oxide layer is 0.65 angstrom per minute. By using such high selection phosphoric acid, after SMT process when the silicon nitride layer 303 is removed, the oxide layer 310 can be preserved.

It is worth noting that, during manufacturing, silicon wafer with the silicon nitride layer and the silicon oxide layer formed thereon is put in a chemical bath containing phosphoric acid. The phosphoric acid will react with the silicon nitride layer to etch away silicon nitride. Therefore, in the chemical bath, the phosphoric acid will be consumed and silicon concentration of the phosphoric acid bath will be increased. After running a period of time, the chemical bath can be partially drained away and refilled with fresh phosphoric acid to maintain the concentration of the phosphoric acid and the silicon concentration within the phosphoric acid bath. Accordingly, the high selectivity of phosphoric acid can be maintained by controlling stable silicon concentration in the chemical bath. The silicon concentration is about in a range between 75 to 140 PPM. Preferably, the silicon concentration is about in a range between 100 to 120 PPM.

Figure 4A:
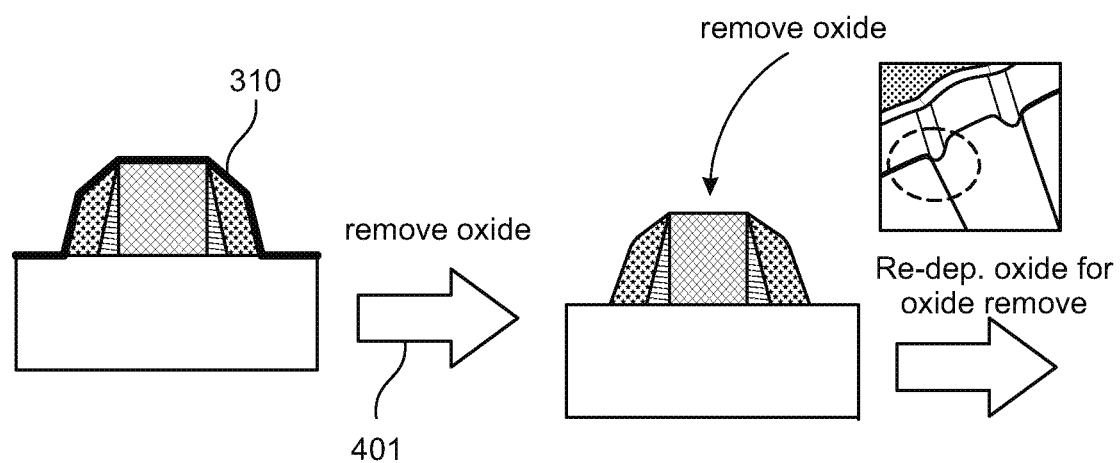
FIG. 4A comprises cross-sectional views of a semiconductor device fabricated in accordance with the SMT process of FIG. 1.
Figure 4B:
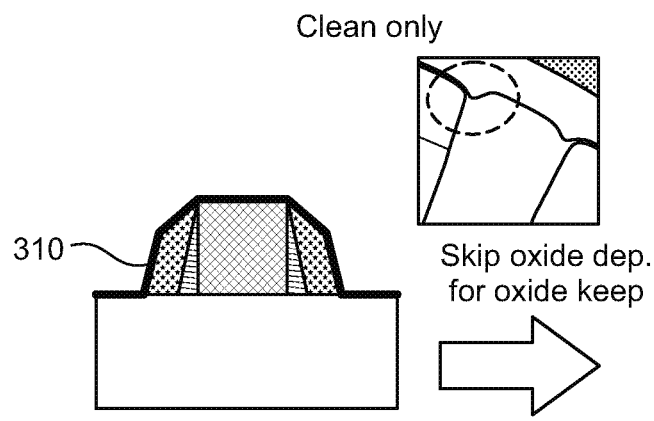
FIG. 4B comprises a cross-sectional view of a semiconductor device fabricated in accordance with an embodiment of the present invention.

Referring to FIG. 4A, oxide layer 310 is traditional removed (step 401) by SPM solution and dipping in DHF. In such a process, another oxide layer needs to be re-deposited causing an extra step. According to an embodiment of this invention, referring the FIG. 4B, oxide layer 310 is simply cleaned without dipping in DHF, thus preserving the oxide layer 310 and reduces manufacturing cost. Furthermore, the Kink Effect can consequently be reduced.

Figure 5:
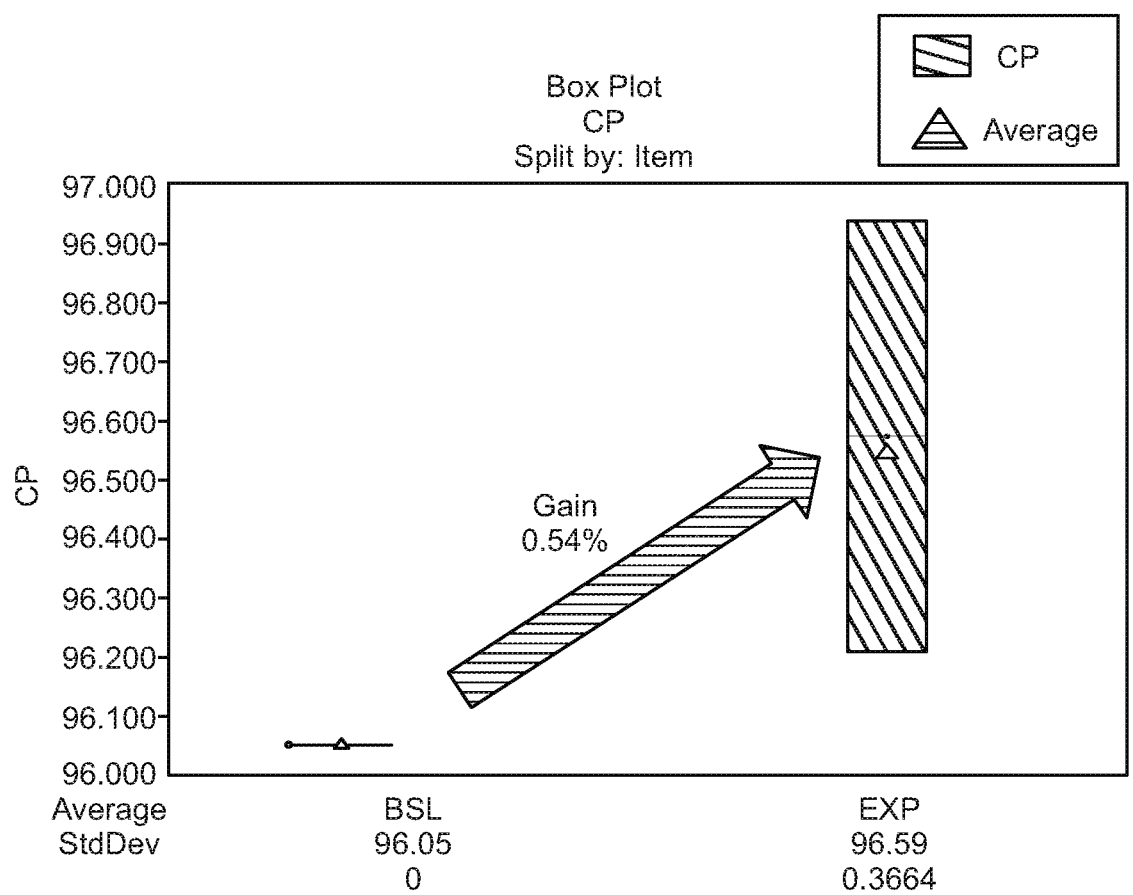
FIG. 5 is a graph showing SMT yield summary illustrating a gain using a current embodiment of this invention over previous implementation.

Referring to FIG. 5, yield gain of 0.54% can be gained one sample run. This translates into significant manufacturing saving.

Figure 6:
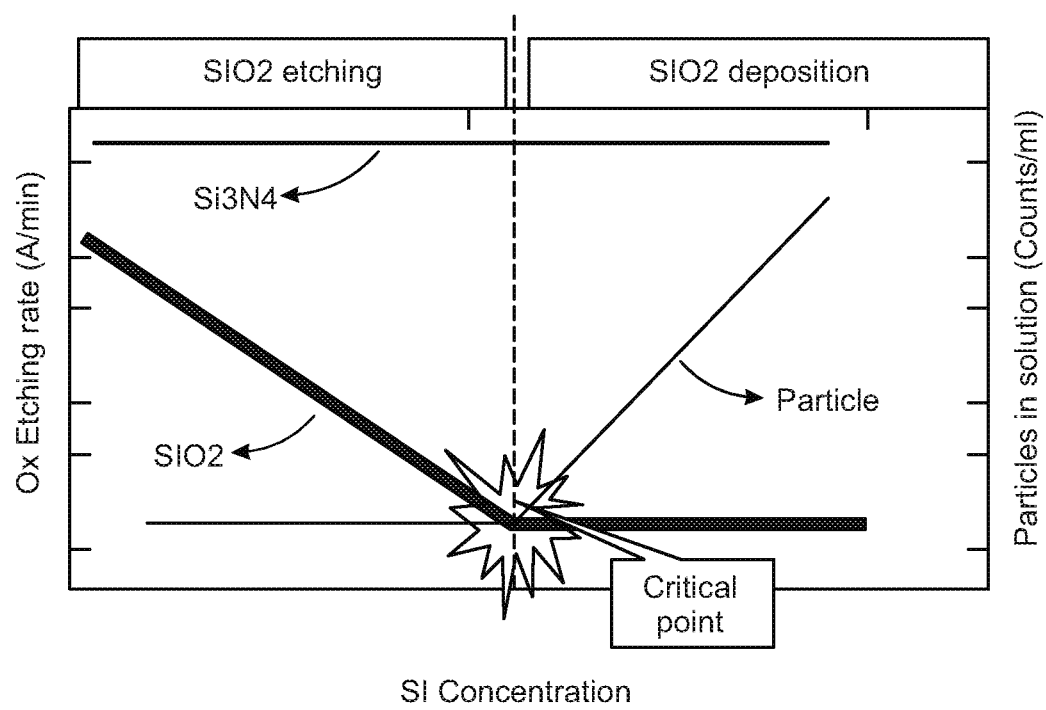
FIG. 6 is a graph showing the critical silicon concentration to minimize oxide etching rate.

Referring to FIG. 6, FIG. 6 shows a chart showing oxide etching rate/particle in solution (PPM) against Si concentration in the X-axis. The critical point of Si concentration is at 110 PPM.

The foregoing description of the invention has been presented for purposes of illustration and description. It is not intended to be exhaustive or to limit the invention to the precise embodiments disclosed.

Those skilled in the art will readily observe that numerous modifications and alterations of the device may be made without departing from the scope, spirit or teachings of the invention. The invention is defined by the following claims and their equivalents:

What I claim is:

1. A method for fabricating a semiconductor device including a substrate, a gate structure thereon, a source/drain region, a spacer on a sidewall of the gate structure; the method comprising steps of:
   depositing an oxide layer to contact the substrate, the gate structure, the source/drain region and the spacer;
   depositing a nitride layer;
   annealing;
   removing the nitride layer with high selection phosphoric acid solution with high silicon concentration, wherein a concentration of silicon in the high selection phosphoric acid solution is at a range between 100 and 120 ppm; and
   forming a cap layer on the oxide layer.

2. The method of claim 1, wherein the high selection phosphoric acid solution is at a temperature greater than 135 degrees centigrade and less than 165 degrees centigrade.

3. The method of claim 1, further comprising: during the step of annealing, the nitride layer and the oxide layer is annealed to transform the oxide layer into a stressed oxide layer.

4. A method for fabricating a semiconductor device, comprising the steps of:
   providing a substrate having a first semiconductor device in a first region and a second semiconductor device in a second region;
   forming a stressed oxide layer on the second semiconductor device in the second region, wherein the step of forming the stressed oxide layer further comprises:
      depositing a stress memorization technique (SMT) nitride layer on an silicon oxide layer;
      annealing the substrate to form the stressed oxide layer; and
      removing the SMT nitride layer with high selection phosphoric acid solution with high silicon concentration, wherein a concentration of silicon in the high selection phosphoric acid solution is at a range between 100 and 120 ppm;
   forming a silicide blocking layer on the stressed oxide layer in the second region;
   forming a silicide layer on the first semiconductor device; and
   after forming the silicide layer, forming a cap layer on the first semiconductor device in the first region and on the silicide blocking layer in the second region.

5. The method of claim 4, wherein the high selection phosphoric acid solution is at a temperature between 135 and 155 degrees centigrade.

6. The method of claim 4, further comprising:
   forming a patterned photoresist covering the second region; and
   patterning the silicide blocking layer and the stressed oxide layer.

7. The method of claim 4, further comprising: cleaning the stressed oxide layer using sulfuric peroxide mix without dipping in hydrofluoric acid solution.

* * * * *